(12) United States Patent
Yamagami

(10) Patent No.: US 7,309,243 B2
(45) Date of Patent: Dec. 18, 2007

(54) BOARD MOUNTED ELECTRICAL CONNECTOR

(75) Inventor: Hidehisa Yamagami, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 0 days.

(21) Appl. No.: 11/129,779

(22) Filed: May 16, 2005

(65) Prior Publication Data

US 2005/0255725 A1 Nov. 17, 2005

(30) Foreign Application Priority Data

May 14, 2004 (JP) .............................. 2004-144454

(51) Int. Cl.
*H01R 12/00* (2006.01)
(52) U.S. Cl. ......................................... 439/83; 439/886
(58) Field of Classification Search .................. 439/83, 439/876, 886
See application file for complete search history.

(56) References Cited

U.S. PATENT DOCUMENTS

| 3,530,422 A | 9/1970 | Goodman |
| 3,989,331 A | 11/1976 | Hanlon |
| 4,743,601 A | 5/1988 | Schonafinger et al. |
| 5,453,016 A | 9/1995 | Clark et al. |
| 5,504,989 A | 4/1996 | Clark et al. |
| 6,164,983 A * | 12/2000 | Lemke et al. .................. 439/83 |
| 2004/0115971 A1 | 6/2004 | Nose et al. |

FOREIGN PATENT DOCUMENTS

| EP | 0234235 A1 | 9/1987 |
| EP | 1073165 A2 | 1/2001 |
| JP | 9069371 | 3/1997 |
| JP | 09069371 | 3/1997 |

\* cited by examiner

*Primary Examiner*—Gary Paumen
(74) *Attorney, Agent, or Firm*—Barley Snyder LLC

(57) ABSTRACT

A circuit board mounted connector is equipped with an insulative housing, which holds a plurality of rows of contacts and is mounted on a circuit board. Each contact has a contact portion, for contacting another connector, and a leg portion, which is connected to the circuit board. Each leg portion has an extending portion that extends from a rear wall of the insulative housing; a flexible portion, which is formed continuously with the extending portions; and a linear portion that extends in a direction substantially perpendicular to the circuit board from the flexible portion and is connected to an aperture of the circuit board. Of the plurality of rows of contacts, at least the row closest to the circuit board has extending portions that extend away from the circuit board, up to the flexible portions. The linear portions of each of the leg portions are partially tin plated.

10 Claims, 1 Drawing Sheet

BOARD MOUNTED ELECTRICAL CONNECTOR

FIELD OF THE INVENTION

The invention relates to a board mounted electrical connector and more particularly the invention relates to a board mounted electrical connector, of the type in which leg portions, of contacts utilized in the electrical connector, extend outwardly from the rear wall of a housing, are bent such that they are substantially perpendicular to the circuit board, and are receivable in apertures of a circuit board.

BACKGROUND

There is known a conventional board mounted electrical connector, as disclosed in Japanese Unexamined Patent Publication No. 9(1997)-069371. This connector comprises contacts, which are arranged in three rows, and an insulative housing, for holding the contacts. Each of the contacts of this connector comprises a contact portion, which has an axis substantially parallel to a circuit board, on which the housing is mounted; and a leg portion, which extends outwardly from the rear wall of the housing, then extends in a direction perpendicular to the axis of the contact portion, and is received in apertures of the circuit board. Each leg portion comprises an extending portion that extends away from the circuit board from the rear wall of the housing; a flexible portion, which is formed continuously with the extending portion; and a linear portion that extends substantially perpendicular to the circuit board from the flexible portion.

In board mounted electrical connectors, rates of thermal expansion differ between insulative housings that form the connectors, and circuit boards that the insulative housings are mounted on. Due to the difference in the rates of thermal expansion, degrees of expansion and contraction of parts due to changes in temperature differ. As a result, stress is generated at connecting portions (soldered portions) between contacts and the circuit board, which may cause the soldered portions to crack. For this reason, the known electrical connector has adopted the extending portions that extend away from the circuit board, thereby extending the entire lengths of the leg portions. The extended lengths of the leg portions absorbs dimensional differences due to expansion and contraction of parts, in an attempt to reduce the stress applied on the connecting portions between the contacts and the circuit board. As a result, the dimensions of the leg portions are enabled to be made larger, even if spacing between the contacts and the circuit board are small. Accordingly, low profile, high density mounting of connectors on circuit boards is capable of being realized.

Normally, the leg portions of contacts are plated with solder that contains lead. This is because the leg portions are soldered to the circuit board with solder that contains lead, and if the leg portions are plated with solder that contains lead, the connection properties are favorable. As a result, there is a possibility that the lead will pollute the environment during production of the electrical connector, or upon disposal of the connector. In the case that the entirety of the leg portions is plated with a metal such as tin that does not contain lead (lead free solder), the possibility of environmental pollution is decreased. However, whiskers (phenomena in which needle like crystals are generated on the surface of the plating) may be generated at the flexible portions of the leg portions. The cause of these whiskers is internal stress, which is generated in the contacts, and the whiskers are likely to appear at the flexible portions. If whiskers are generated, they cause adjacent contacts to short, thereby causing a problem that desired electrical connection properties cannot be obtained.

SUMMARY

The present invention has been developed in view of the above circumstances. It is an object of the present invention, among others, to provide a board mounted electrical connector, which is capable of realizing low profile, high density mounting, while preventing environmental pollution by lead, and preventing the generation of whiskers.

The board mounted electrical connector of the present invention comprises contacts; and an insulative housing for holding the contacts in a plurality of rows. Each of the contacts has a contact portion for contacting another connector; and a leg portion that protrudes outwardly from a rear wall of the insulative housing, to be connected to a circuit board. Each of the leg portions has an extending portion that extends from the rear wall of the insulative housing; a flexible portion, formed continuously with the extending portion; and a linear portion that extends from the flexible portion toward the circuit board substantially perpendicular thereto, to be inserted through apertures in the circuit board and connected thereto. At least the contacts in the row closest to the circuit board have extending portions that extend from the rear wall of the insulative housing in a direction away from the circuit board, up to the flexible portions. The linear portions of each of the leg portions are partially tin plated meaning that a portion or the entirety of the linear portion is tin plated, and that other portions of the leg portion, such as the flexible portion, are not tin plated.

Here, the tin plating may be plating with pure tin, or with tin alloys that do not contain lead, such as tin-copper alloys and tin-bismuth alloys.

The linear portion may be perfectly linear. Alternatively, the linear portion may have a slightly swollen shape, to impart elasticity in the direction perpendicular to the axis thereof. The swollen portion may be configured to be connected with the circuit board.

The flexible portion may be intentionally formed with an arcuate portion having a large radius. Alternatively, the flexible portion may have a small diameter arcuate portion, formed by simply bending a linear leg portion.

According to the first board mounted electrical connector of the present invention, at least the contacts in the row closest to the circuit board have extending portions that extend from the rear wall of the insulative housing in a direction away from the circuit board, up to the flexible portions. In addition, the linear portions of the leg portions are partially tin plated. Therefore, low profile mounting of the electrical connector is realized, while preventing environmental pollution by lead. Further, because tin plating is not performed at the flexible portions, generation of whiskers is also prevented.

According to the second board mounted electrical connector of the present invention, the extending portions extend from the rear wall of the insulative housing in a direction away from the circuit board, up to the flexible portions. In addition, the linear portions of the leg portions are partially tin plated. Therefore, environmental pollution by lead is prevented, as well as generation of whiskers, because tin plating is not performed at the flexible portions.

BRIEF DESCRIPTION OF THE DRAWINGS

FIGS. 1A and 1B are schematic diagrams of board mounted electrical connectors according to a first embodiment of the present invention, wherein FIG. 1A illustrates a case in which the entire lengths of leg portions are relatively short, and FIG. 1B illustrates a case in which the entire lengths of leg portions are relatively long.

DETAILED DESCRIPTION OF THE EMBODIMENT(S)

Figure 1A:
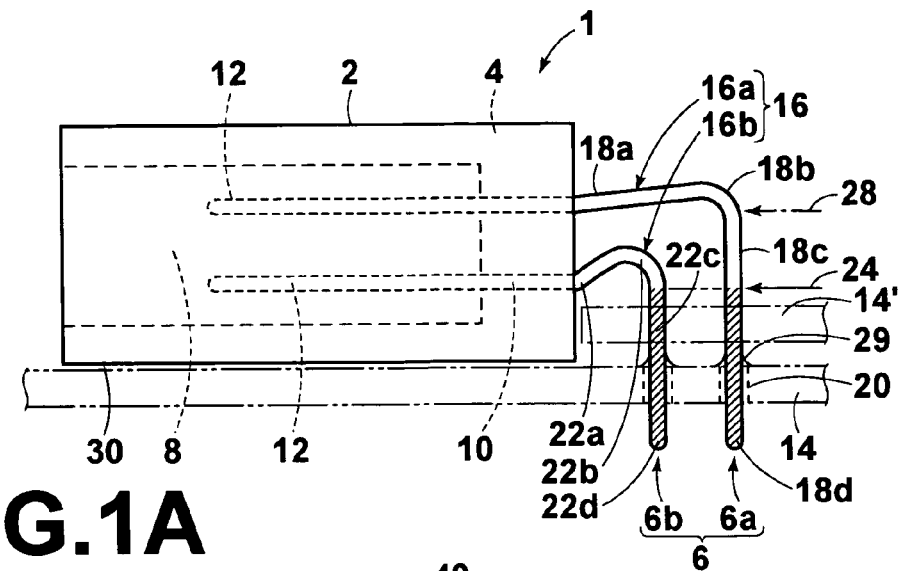
Figure 1B:
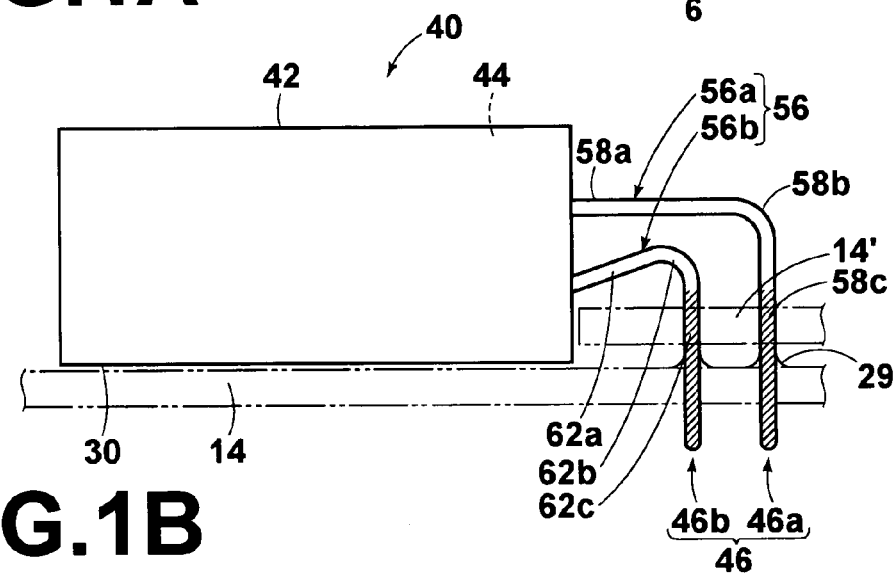

Hereinafter, embodiments of the board mounted electrical connector (hereinafter, simply referred to as "connector") according to the present invention will be described in detail with reference to the attached drawings. FIG. 1A illustrates a case in which the entire lengths of the leg portions are relatively short, and FIG. 1B illustrates a modification, in which the entire lengths of the leg portions are relatively long. First, a description will be given with reference to FIG. 1A. The connector 1 generally includes an insulative housing 2, to be mounted onto a circuit board 14, and a plurality of contacts 6 (6a, 6b), which are held by the insulative housing 2. An engaging recess 8, for receiving another connector (not shown), is formed in the insulative housing 2.

The contacts 6 are constituted by upper contacts 6a and lower contacts 6b. Both the upper contacts 6a and the lower contacts 6b are arranged in directions perpendicular to the surface of the drawing sheet of FIGS. 1A and 1B. In the first embodiment, the upper and lower contacts 6 are arranged in two rows. However, three or more rows of contacts may be provided. Each of the contacts 6 comprises a holding portion 10, which is inserted through a rear wall 4 of the insulative housing 2 and held thereby by being press fit or the like; a contact portion 12 that extends linearly forward, that is, toward an engagement direction from the holding portion 10, to contact contacts of another connector (not shown); and a leg portion 16 that extends rearward from the rear wall 4 to be connected with the circuit board 14. Note that the insulative housing 2 may be fixed to the circuit board 14 by only the leg portions 16. Alternatively, other fixing means, such as screws (not shown), may be employed in addition to the leg portions 16, to fix the insulative housing 2 to the circuit board 14.

Each of the leg portions 16a of the upper contacts 6a comprises: an extending portion 18a that extends from the rear wall 4 in a slightly upwardly inclined direction; a bent or flexible portion 18b, which is formed continuously with the extending portion 18a; and a linear portion 18c that extends downward from the flexible portion 18b, in a direction substantially perpendicular to the circuit board 14. The linear portion 18c is inserted through an aperture 20 corresponding thereto of the circuit board 14, and is soldered to the circuit board 14 with a lead free solder, such as tin-copper solder.

Meanwhile, each of the leg portions 16b of the lower contacts 6b comprises: an extending portion 22a that extends from the rear wall 4 in a sharply upwardly inclined direction; a bent or flexible portion 22b, which is formed continuously with the extending portion 22a; and a linear portion 22c. The differences between the leg portions 16b and the leg portions 16a are that the entire lengths of the lower leg portions 16b are shorter than those of the upper leg portions 16a and that the extending portions 22a extend in a direction away from the circuit board 14 at a relatively acute angle. The extending portions 18a and 22a extend in directions away from the circuit board in order to increase the lengths of the leg portions 16a and 16b from the rear wall 4 to the circuit board 14 as much as possible within a limited mounting surface area. Thereby, the difference in degrees of expansion/contraction, due to the difference in the rate of thermal expansion between the connector 1 and the circuit board 14, can be absorbed. Accordingly, the amount of force exerted on the connecting portions among the circuit board 14 and the linear portions 18c and 22c is reduced, thereby preventing cracks from forming at soldered portions 29 of the connecting portions.

What is important to note here is that the leg portions 16 are partially tin plated. The linear portions 22c of the leg portions 16b of the lower contacts 6b are tin plated. That is, the leg portions 16b are tin plated from the tips 22d thereof up to the beginning of the flexible portions 22b. The tin plated portions are indicated by hatching in FIGS. 1A and 1B. The leg portions 16a of the upper contacts 6a are tin plated from the tips 18d thereof up to the same heights as the tin plated portions of the linear portions 22c of the leg portions 16b. That is, the leg portions 16a are tin plated up to the position indicated by arrow 24 in FIG. 1A.

The leg portions 16a of the upper contacts 16a may be tin plated along the entirety of the linear portions 18c, up to the flexible portions 18b. That is, the leg portions 16a may be tin plated up to the position indicated by arrow 28 in FIG. 1A. Tin plating is administered on either the entirety or a part of the linear portions 18c and 22c, but not on the flexible portions 18b and 22b. Therefore, there is no possibility that whiskers will be generated on the flexible portions 18b and 22b.

Note that the tin, which is used as the plating material, may be either pure tin or a tin alloy that does not contain lead. For example, a tin-copper alloy lead free solder may be plated, and soldering may also be performed using the tin-copper lead free solder. In this case, the soldering properties are favorable, and manufacturing costs can also be suppressed. Alternatively, plating may be performed using a tin-bismuth alloy lead free solder.

Next, the manufacturing steps of the connector 1, through the point when tin plating is performed, will be described. The contacts 6 are punched from a metal plate of copper alloy or the like by stamping. Then, the entirety of each of the contacts 6 is nickel plated. Thereafter, portions of the leg portions 16 of the contacts 6 are tin plated for a predetermined length from the tips 18d and 22d thereof. That is, the leg portions 16 are tin plated up to the position indicated by the aforementioned arrow 24, or in the case of the leg portions 16a, up to the position indicated by the arrow 28. Next, the contacts 6 are bent into predetermined shapes then press fit into the rear wall 4 of the insulative housing 2, to construct the connector 1. Alternatively, the contacts 6 are pressed into the rear wall 4 of the insulative housing 2, then bent into their predetermined shapes, to construct the connector 1.

Next, an alternate connector 40, which is a modification of the connector 1, will be described with reference to FIG. 1B. Note that in the following description, elements which are the sane as those illustrated in FIG. 1A will be described with the same reference numerals. In addition, the inner structure of the connector 49 is the same as that of the connector 1, and therefore a description thereof will be omitted. The connector 40 differs from the connector 1 in that the entire lengths of leg portions 56 (56a, 56b) of contacts 46 (46a, 46b) are longer. For this reason, the connector 40 is better able to absorb stress generated at the connecting portions, that is, the soldered portions 29, between the connector 40 and the circuit board 14, due to differences in rates of expansion/contraction thereof.

Accordingly, extending portions 58a of the upper contacts 46a extend substantially parallel to the circuit board 14. The angle, at which extending portions 62a of the lower contacts 46b extend away from the circuit board 14 from a rear wall 44 of an insulative housing 42, is smaller than that of the extending portions 22a of the connector 1. Linear portions 58c and 62c of the leg portions 56 of the connector 40 are partially tin plated, in the same manner as in the connector 1. Tin plating is performed on the linear portions 58c and 62c, while avoiding bent or flexible portions 58b and 62b, in the same manner as in the connector 1. Therefore, a detailed description will be omitted.

In the connectors 1 and 40 illustrated in FIGS. 1A and 1B, the lengths of the leg portions 16 and 56 may be extended, even if the distance between the holding portions 10 and bottom surfaces 30 of the connectors 1 and 40 are short. This is accomplished by forming the extending portions 18a, 22a, and 62a such that they extend away from the circuit board 14. Therefore, if the circuit board 14 is placed at the position indicated by reference numeral 14', low profile mounting of the connectors is enabled. Accordingly, the mounting surface areas of the connectors 1 and 40 can be kept small, while enabling low profile mounting of a plurality of connectors at high density on the circuit board 14.

Figure 2:
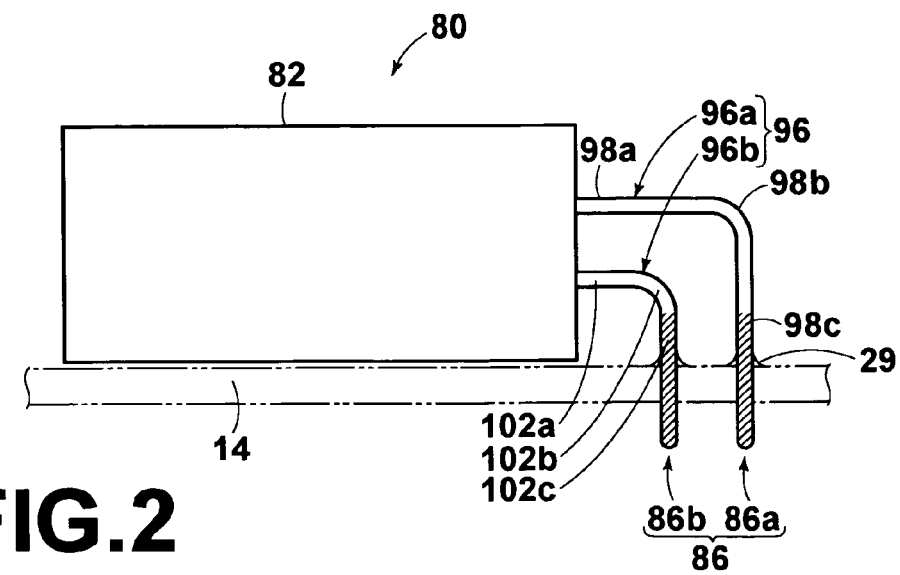
FIG. 2 is a schematic diagram of a board mounted electrical connector according to a second embodiment of the present invention.

Next, a connector 80, according to a another embodiment of the present invention, will be described with reference to FIG. 2. FIG. 2 is a schematic view of the connector 80 according to the second embodiment. The connector 80 of the second embodiment differs from the connectors 1 and 40 illustrated in FIGS. 1A and 1B in that extending portions 98a and 102a, of leg portions 96 (96a, 96b) of contacts 86 (86a, 86b) which are held by an insulative housing 82, extend substantially parallel to the circuit board 14. The shape of these leg portions 96 is suitable for cases in which there is ample space for long leg portions 96, or for cases in which the difference in rates of thermal expansion between the insulative housing 82 and the circuit board 14 is small. In this case as well, linear portions 98a and 102c may be partially tin plated, at the portions indicated by hatching in FIG. 2. This partial tin plating may be performed up to bent or flexible portions 98b and 102b, in the same manner as in the case of the connectors 1 and 40 illustrated in FIGS. 1A and 1B.

In the case of the connector 80 illustrated in FIG. 2, the extending portions 98a and 102a are parallel to the circuit board. Therefore, it is difficult to minimize the mounting surface area of the connector 80, and also difficult to realize low profile mounting of the connector 80. However, environmental pollution by lead, and formation of cracks at soldered portions (connecting portions between the connector 80 and the circuit board 14) can be prevented.

What is claimed is:

1. A board mounted electrical connector comprising:
   an insulative housing having a rear wall for receiving contacts in a plurality of rows;
   the contacts each having a contact portion for contacting another connector and a leg portion that protrudes outwardly from the rear wall of the insulative housing to be connected to a circuit board;
   each of the leg portions having an extending portion that extends from the rear wall, a bent portion formed continuously with the extending portion, and a linear portion that extends from the bent portion toward the circuit board substantially perpendicular thereto to be inserted through apertures in the circuit board and connected thereto, at least the contacts arranged in one of the plurality of rows which is closest to the circuit board extending from the rear wall of the insulative housing in a direction away from the circuit board up to the bent portions; and
   each of the leg portions being partially tin plated, including plating at least part of the linear portion but not the bent portion, such that the generation of whiskers caused by internal stress on the leg portions is prevented.

2. The board mounted electrical connector as defined in claim 1, wherein the leg portions are partially plated with a tin alloy.

3. The board mounted electrical connector as defined in claim 1, wherein the contacts are nickel plated.

4. The board mounted electrical connector as defined in claim 1, wherein the linear portions are tin plated from a tip of the linear portion to a beginning of the bent portion.

5. A board mounted electrical connector comprising:
   an insulative housing having a rear wall for receiving contacts in a plurality of rows;
   the contacts having a contact portion for contacting another connector and a leg portion that protrudes outwardly from the rear wall of the insulative housing to be connected to a circuit board;
   each of the leg portions having an extending portion that extends from the rear wall of the insulative housing, a bent portion formed continuously with the extending portion, and a linear portion that extends from the bent portion toward the circuit board substantially perpendicular thereto, the linear portion having a tip to be inserted through apertures in the circuit board and connected thereto, the extending portions extending from the rear wall of the insulative housing in a direction away from the circuit board up to the bent portions; and
   each of the leg portions having tin plating applied solely to the linear portions thereof such that the generation of whiskers caused by internal stress on the leg portions is prevented.

6. The board mounted electrical connector as defined in claim 5, wherein the linear portions of each of the leg portions are plated with a tin alloy.

7. The board mounted electrical connector as defined in claim 5, wherein the contacts are nickel plated.

8. The board mounted electrical connector as defined in claim 7, wherein the tin plating is applied over the nickel plated contacts.

9. The board mounted electrical connector as defined in claim 5, wherein the plurality of rows include an upper row and a lower row, the linear portion of the contacts of the upper and lower rows having tin plating applied thereto from the tips thereof to the same height.

10. The board mounted electrical connector as defined in claim 5, wherein each of the linear portions are entirely tin plated from the tip to a beginning of the bent portion.

* * * * *